United States Patent
Andry et al.

(10) Patent No.: US 9,953,501 B2
(45) Date of Patent: *Apr. 24, 2018

(54) METHODS OF FORMING MICROELECTRONIC SMART TAGS

(71) Applicant: International Business Machines Corporation, Armonk, NY (US)

(72) Inventors: Paul S. Andry, Yorktown Heights, NY (US); Monty Montague Denneau, Brewster, NY (US); John U. Knickerbocker, Monroe, NY (US); Robert L. Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/466,122

(22) Filed: Mar. 22, 2017

(65) Prior Publication Data

US 2017/0193775 A1 Jul. 6, 2017

Related U.S. Application Data

(63) Continuation of application No. 14/927,013, filed on Oct. 29, 2015, now Pat. No. 9,684,862.

(51) Int. Cl.
*G06K 19/077* (2006.01)
*G08B 13/24* (2006.01)
(Continued)

(52) U.S. Cl.
CPC ..... *G08B 13/244* (2013.01); *G06K 19/07749* (2013.01); *H01L 21/78* (2013.01);
(Continued)

(58) Field of Classification Search
CPC ....... G06K 19/07745; G06K 19/07747; G06K 19/07749; G06K 19/0775;
(Continued)

(56) References Cited

U.S. PATENT DOCUMENTS

| | | |
|---|---|---|
| 4,857,893 A | 8/1989 | Carroll |
| 5,777,903 A | 7/1998 | Piosenka et al. |

(Continued)

OTHER PUBLICATIONS

Smartrac, "Smart-I-Mini-Tag," smartrac-group.com, Oct. 2013, 2 pages.

(Continued)

*Primary Examiner* — Suezu Ellis
(74) *Attorney, Agent, or Firm* — Vazken Alexanian; Ryan, Mason & Lewis, LLP

(57) ABSTRACT

A method comprises forming a structure, the structure comprising at least one of a wafer, a panel and a roll to roll structure and forming a plurality of integrated circuit chips from the structure. At least a given one of the plurality of integrated circuit chips or a heterogeneous integrated subcomponent thereof forms a smart tag comprising a processor, a non-volatile memory, an internal power source, and a transceiver configured for two-way communication with a reader external to the smart tag. The given integrated circuit chip less than 10 cubic millimeters in size.

20 Claims, 3 Drawing Sheets

(51) Int. Cl.
*H01L 31/054* (2014.01)
*H01L 23/544* (2006.01)
*H01L 23/66* (2006.01)
*H01L 21/78* (2006.01)

(52) U.S. Cl.
CPC ............ *H01L 23/544* (2013.01); *H01L 23/66* (2013.01); *H01L 31/0547* (2014.12); *H01L 2223/54426* (2013.01); *H01L 2223/6677* (2013.01)

(58) Field of Classification Search
CPC .......... G06K 19/07775; G06K 19/0702; H01L 31/054; H01L 21/78; G08B 13/2437; G08B 13/244
USPC .................................................. 235/488, 492
See application file for complete search history.

(56) References Cited

U.S. PATENT DOCUMENTS

| | | | |
|---|---|---|---|
| 6,050,494 A | 4/2000 | Song et al. | |
| 6,056,199 A | 5/2000 | Wiklof et al. | |
| 6,604,685 B1 | 8/2003 | Norton | |
| 7,652,557 B2 | 1/2010 | Kantrowitz et al. | |
| 7,932,828 B2 | 4/2011 | Britton, Jr. et al. | |
| 9,418,895 B1* | 8/2016 | Andry | H01L 21/78 |
| 9,684,862 B2 | 6/2017 | Andry et al. | |
| 2003/0062988 A1 | 4/2003 | Mandecki et al. | |
| 2004/0069853 A1 | 4/2004 | Aharonson | |
| 2005/0116813 A1 | 6/2005 | Raskar | |
| 2008/0000990 A1 | 1/2008 | Thomas | |
| 2008/0094201 A1 | 4/2008 | Paradiso et al. | |
| 2008/0135615 A1 | 6/2008 | Moran | |
| 2009/0066517 A1* | 3/2009 | Erikson | G06K 19/07749 340/572.7 |
| 2009/0303052 A1 | 12/2009 | Aklepi et al. | |
| 2010/0001846 A1 | 1/2010 | Cardullo | |
| 2010/0022836 A1* | 1/2010 | Colliou | A61B 5/0031 600/118 |
| 2012/0322239 A1* | 12/2012 | Singh | H01L 21/78 438/462 |
| 2013/0009750 A1* | 1/2013 | Tumer | G06K 19/0723 340/10.1 |
| 2014/0291405 A1 | 10/2014 | Harkes | |

OTHER PUBLICATIONS

List of IBM Patents or Patent Applications Treated as Related, Mar. 22, 2017.

* cited by examiner

100

200

300

104

500

METHODS OF FORMING MICROELECTRONIC SMART TAGS

BACKGROUND

The present invention relates to communication systems, and more specifically, to smart tags used in communication systems. Smart tags are used in a variety of contexts, including tracking of products, persons or other information. For example, smart tags can be used for supply chain tracking or more generally information tracking for products and other items. Smart tags may also be used in medical contexts, such as tracking and monitoring of physiological information of a subject. Various factors, including but not limited to cost, present a barrier to more wide-scale adoption of smart tags for use in a variety of applications.

SUMMARY

Embodiments of the invention provide techniques for low cost and low power smart tags.

For example, in one embodiment, a smart tag comprises a processor, a non-volatile memory, at least one of an internal power source and an external power source, and a transceiver configured for two-way communication with a reader external to the smart tag. The smart tag is formed as an integrated circuit chip less than 10 cubic millimeters in size to less than 0.000125 cubic millimeters in size. In another embodiment, an apparatus comprises the smart tag and an antenna connected to the smart tag.

DETAILED DESCRIPTION

Figure 1:
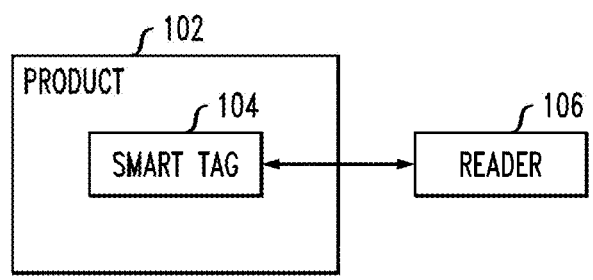
FIG. 1 depicts a communication system including a smart tag, according to an embodiment of the invention.

Illustrative embodiments of the invention may be described herein in the context of illustrative methods, systems and devices for micro-systems communication platforms. However, it is to be understood that embodiments of the invention are not limited to the illustrative methods, systems and devices but instead are more broadly applicable to other suitable methods, systems and devices.

As discussed above, smart tags can be used in a variety of applications. Smart tags may be used for product or supply chain tracking. Smart tags may also include biosensors used to monitor a health status or other information of an associated person or animal. Smart tags are subject to varying power, size and communication requirements based on the application or context in which a particular smart tag will be used. In addition, cost may present a barrier to adoption of smart tags for particular applications.

As an example, some mobile systems today have various power, size and communications challenges not adequately met by existing smart tags. Embodiments of the invention provide for low power and low cost smart tags which may be used in such mobile systems, as well as in other types of systems for various application contexts.

In some embodiments, smart tags are provided with efficient communication means providing for two-way communication utilizing one or more wireless transmission techniques. Wireless transmission may also be used as an option for providing power to the smart tag from an external power source, allowing the smart tag to power up and operate, charge an internal power source or power storage device or subcomponent as well as supporting communication to and from the smart tag or other sub-components such as sensors. Such wireless transmission techniques include, by way of example, wireless radio frequency (RF), sound, light etc. as will be described in further detail below. The particular type of wireless communication used for a smart tag may depend on context. For example, light-based wireless communication may not be suitable for some contexts such as implanted or ingestible biosensors. For such use cases, ultrasound, RF or another wireless transmission technique such as near field communication (NFC) may be preferred for communications to and from the smart tag to add information to a memory of the smart tag, retrieve information from the smart tag, or provide power to the smart tag from an external source. As another example, light-based transmission techniques may be used to reduce the size of a smart tag.

The two-way communication supports data transmission using security such as encryption. The two-way communication may further enable power on, power off, and/or sleep modes of a smart tag, as well as for communication of information or data to or from the smart tag and another device such as a reader.

Smart tags used in some embodiments include a non-volatile memory to provide for information tracking. The use of a non-volatile memory allows a smart tag to store information such as an identification (ID), security credentials, and information about a product such as time, location, temperature, etc. The above-described two-way communication allows for such information about the product to be updated over time. The information may be gathered for use in generating a trace of such information over time. For example, storing a series of timestamped location values in the smart tag facilitates supply chain tracking for a product. In addition, the smart tag may have security encryption with one or more codes. One or more of the codes may be used for multiple tags in some embodiments. In other embodiments, one or more of the tags may be unique codes for a particular smart tag. The smart tag can be started or restarted from a sleep mode or period of storage or inactivity using a reduced level of power consumption or no power for some period of time using such codes. The codes may also be utilized for authorizing transmission of information or data to or from a smart tag.

Smart tags used in some embodiments further utilize ultra-low power communications, using either an on board or external power source. Power may be supplied by RF, light, sound, one or more batteries or capacitors, photovoltaic, vibration or other internal and/or external power sources including combinations of such power sources. In addition, smart tags used in some embodiments are small in size thus providing various cost and other benefits to be described in further detail below.

FIG. 1 shows an example of a communication system 100, including a product 102 with a smart tag 104 affixed thereto and a reader 106 configured to communicate with the smart tag 104. It is important to note that the smart tag 104 need not be physical attached to the product 102. In some embodiments, the smart tag 104 may be placed in close proximity to the product 102 but not necessarily physically attached thereto. In other embodiments, the smart tag 104 may be incorporated within a housing of the product 102. As an example, a cellular phone, tablet, laptop or other electronic device may have one or more smart tags built in or physically attached to its housing or a component thereof. The term "affixed" should therefore be broadly construed to cover these and other similar arrangements.

While FIG. 1 shows only a single product 102, smart tag 104 and reader 106, it should be appreciated that smart sensor platforms or more generally communications systems may include multiple instances of the product 102, smart tag 104 and reader 106. Although not explicitly shown in FIG. 1, the product 102 may have multiple different smart tags affixed thereto. The smart tag 104 may also be affixed to or otherwise associated with a group of products rather than a single product. For example, a smart tag may be affixed to or associated with a box, crate, pallet, shipping container, shelf, aisle, floor or housing that includes multiple products. As another example, a smart tag may be affixed to one or more wearable health care devices, a pill, a surgical implant, an human or animal organ, bone or other features, to clothing, shoes, collars, hats, human or animal medical or sports related clothing or wearable support devices, etc. As a further example, a smart tag, wearable or Internet of Things (IoT) smart tag enabled sensor may be sealed to be resistant to moisture or hermetic to prevent electronics corrosion or reliability issues, may be sterilized to support applications such as use with an implant, invasive application, wearable application, ingestible application, etc. In some of these and other applications, a smart tag may need to be bio-compatible and/or environmentally compatible to permit use of the smart tag with humans or animals, for single or multiple use, for safe environmental disposal, etc.

The system 100 is an example of what is referred to herein as a smart sensor platform. A smart sensor platform includes a primary micro-electronic smart tag, such as smart tag 104, which may be used for various application areas. As an example the smart tag 104 shown in FIG. 1 is illustratively used for tracking product 102. Although not explicitly shown in FIG. 1, a smart sensor platform may include additional complementary smart tags providing added functionality to be described below.

The system in FIG. 1 shows smart tag 104 being used for product tracking. The smart tag 104 may be scanned by a reader 106 as the product 102 moves from location to location, or may be scanned in the same location at different times. In one or more of such scans, the reader 106 may read from the smart tag 104 or write information to the smart tag 104. Such information may include, by way of example, the time and current location, exposure to environmental conditions such as humidity, temperature, exposure to gases, chemicals, rain, etc. At various points in a supply chain or during a product lifetime, such information maybe uploaded to the reader 106. Such points may include, by way of example, manufacture, movement, storage, shipping, use, disposal, etc.

In some embodiments, the smart tag 104 itself includes sensors that can be used to detect location or other environmental conditions. In other embodiments, such information may be provided by the reader 106 or by the aforementioned complementary smart tags. The product 102, for example, may be one of several products in a box, crate, pallet, shelf or other storage location. Each of the several products may include respective smart tags affixed thereto or otherwise associated with respective ones of the products. The box, crate, pallet, shelf, etc. may have a complementary smart tag such as a humidity, temperature and/or location sensor that periodically pushes updated humidity, temperature or location information to the primary smart tags affixed to each product in the box, crate or pallet. In other embodiments, a smart tag associated with a group of products may be considered the primary smart tag, with various complementary smart tags reporting information for different individual products.

By tracking information such as product location, product history, exposure to environmental conditions, etc, a time trace may be created for the product 102 and other products that can be used in managing a supply chain of a product, materials used, lots of materials, the shelf life of products, sale date of products, etc. Such information may be combined with data analytics or used as feedback for data trending and used for business enhancements such as improved costs and efficiencies. Such improvements may be obtained by modifying the supply chain, materials used, product use, sales, scheduling, pricing and other enhancements for other existing or future product supply chains and/or other existing or future products.

Since smart tags used in some embodiments support two-way communication, tracking information may be added to a smart tag over time and accessed later on. This can be useful for diagnostics, troubleshooting, etc. associated with products in addition to other business enhancements described above. Secure two-way communications with a smart tag allow for the use of the smart tag for authentication or security purposes, such as ensuring the validity of products, fraud protection and/or counterfeit detection. As an example, smart tags may be used to detect counterfeit goods or to track currency.

Although described above in the context of products such as goods in a supply chain, smart tags such as smart tag 104 may be used in other contexts. By way of example, smart tag 104 may be affixed to or associated with a human, animal, plant or other subject for monitoring of physiological values and other information. In such embodiments, the smart tag 104 may be formed from environmentally and health-friendly materials. In these cases, tests of one or more materials may be conducted to check for human or animal compatibility or environmental friendliness. Human or animal compatibility and environmental friendliness of certain materials may also be previously known through existing publications or research. Human, animal or plant testing may be used to verify compatibility such as human cell compatibility versus detriment. Likewise, the use of environmentally friendly materials may be selected to avoid detrimental materials such as but not limited to arsenic, lead, mercury and other non-bio friendly materials or poisons. In some embodiments, smart tags may be sealed to prevent moisture penetration or be made hermetic using coatings such as SiN, $SiO_2$, Ti, $Al_2O_3$ or other materials. The use of moisture sealing and/or coatings may be used in addition to the use of environmentally or human-friendly materials in some embodiments. Moisture sealing and coating, however, may also be used in other application areas not necessarily requiring environmentally or human-friendly materials. Depending on the selection of materials for the smart tag, sealing and/or coating may be achieved using techniques such as sputtering, chemical vapor deposition, atomic layer deposition, plating, etc.

Smart tags fabricated using health-friendly materials may permit such smart tags to be ingested or implanted into a human or animal for medical monitoring. The use of environmentally friendly materials can allow for ease of disposal of smart tags without causing harm to the environment or a user of the smart tag.

As other examples, smart tag 104 may be used for logistics, consumer purchases, security/authentication, smart sensors, smart actuators, etc.

Several of the above-described application areas share common features, such as the use of persistent or non-volatile memory, RF or other wireless communications, RF or other external power source, etc. These application areas also benefit from the use of low cost smart tags. Various embodiments provide techniques used to produce smart tags at low costs.

Some application areas, such as consumer purchases and security, also benefit from tamper-proof smart tags. For example, smart tags may be used to detect unauthorized modification of electronics, such as smart phones, tablets, etc. Smart tags may be used to monitor and detect these and other products for tampering or exposure to environmental conditions which would void a warranty or assist in trouble-shooting and repair. Smart tags may also be used for security, to ensure that sensitive equipment such as network elements including routers, switches and the like have not been tampered with. Smart tags may also be used in clothing for security or tamper detection, as well as for security with sensors and multiple tag communications. As described above, a smart tag in some embodiments may function as a biosensor, implant, location tracking or history device for use in surgical or wearable device tracking. Placement and history tracking with updates maintained in the smart tag can allow tracking before, during or after surgery or placement. Follow on tracking for hours, days, months, years or decades allows for short or long-term medical monitoring based on the needs of a particular use case.

Smart tags used in various embodiments, as will be described in further detail below, can be of extremely small size and low cost, allowing the tracking and monitoring of pill consumption, use of smart tags like RFID tags for use in detecting or tracking counterfeit money, checks, credit cards and various other items. As compared to conventional RFID tags which may cost several dollars or more each, some embodiments of the invention allow for low cost smart tags at very small sizes that cost a fraction of a penny (e.g., less than 0.0001 dollars per smart tag).

Figure 2:
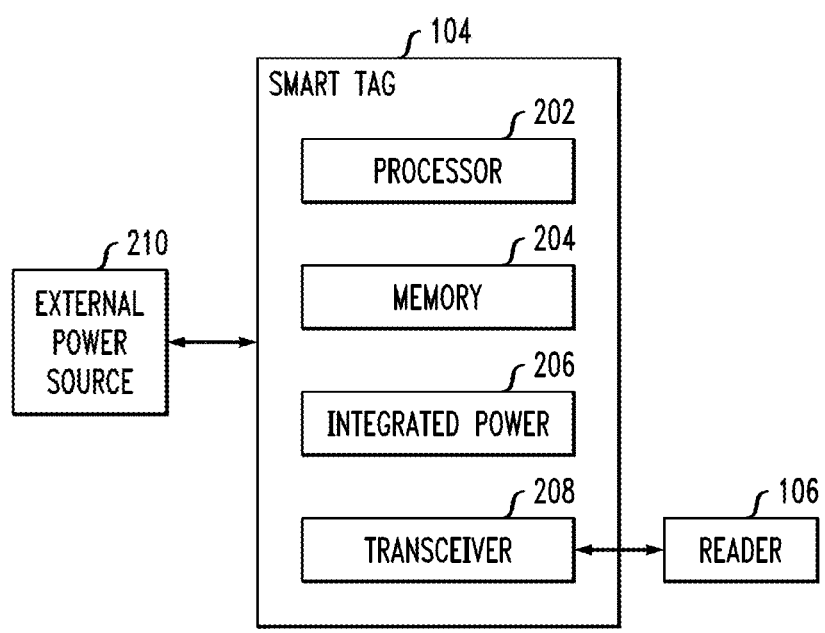
FIG. 2 depicts a detailed view of a smart tag, according to an embodiment of the invention.

FIG. 2 shows a system 200 including a detailed view of smart tag 104 in an embodiment. Similar to FIG. 1, the smart tag 104 is configured for two-way communication with reader 106. The reader 106 may be another smart tag or other computing device. As shown, the smart tag 104 includes processor 202, memory 204, internal power source 206 and a transceiver 208. The smart tag 104 is also configured to receive power from an external power source 210. It should be noted, however, that smart tags used in embodiments do not require the use of both internal and external power sources. In some embodiments, a smart tag may use internal power sources only or external power sources only. For example, in some embodiments a smart tag 104 may have only limited integrated charge storage and rely on external power sources only. The smart tag 104 may use various energy harvesting techniques, such as focused light beams, piezoelectric energy harvesting storage via ultrasound or other vibration, use of one or more antennas that receive RF or NFC for power transmission to the smart tag, etc.

The processor 202 may be a microprocessor or micro-controller. The memory 204 is a non-volatile memory. Various types of non-volatile memory may be used, including but not limited to flash memory, phase change memory, magnetoresistive random access memory (MRAM), ferro-electric enable memory, and other types of storage media. The internal power source 206 may include one or more capacitors, batteries, photovoltaics, etc. The transceiver 208 may take various forms depending on the type of wireless communication used (e.g., RF, NFC, light, sound or ultra-sound, vibration, etc.).

Figure 3:
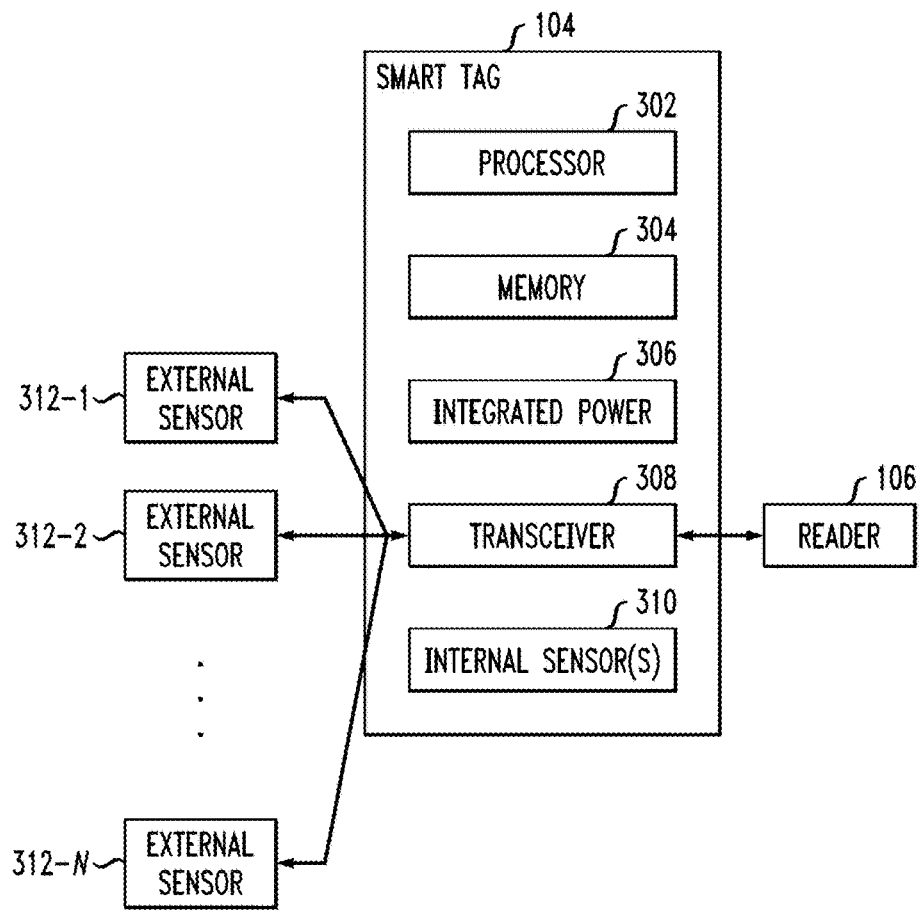
FIG. 3 depicts another detailed view of a smart tag, according to an embodiment of the invention.

FIG. 3 shows a system 300 including a detailed view of smart tag 104 in another embodiment. The smart tag 104 includes processor 302, memory 304, internal power source 306 and transceiver 308, which may be configured in a manner similar to that described above with respect to the processor 202, memory 204, internal power source 206 and transceiver 208 in FIG. 2.

The smart tag 104 in FIG. 3 further includes internal sensors 310 and/or electrically or optically connected external sensors such as external sensors 312. The smart tag 104 is configured for communication with such external sensors 312 as well as the reader 106. Although not explicitly shown in FIG. 3, the smart tag 104 may also be configured for communication with other smart tags, devices and communication messaging systems. In addition, while the system 300 in FIG. 3 includes both internal and external sensors, embodiments are not limited to this arrangement. In some embodiments, a smart tag may include only internal sensors or be configured for communication with external sensors only. The internal sensors 310 and external sensors 312 may be various types of sensors including but not limited to clocks, location sensors such as global positioning system (GPS) sensors, accelerometers, voltmeters, ammeters, mul-timeters, temperature sensors such as thermistors or ther-mocouples, humidity or moisture sensors, radiation or other particle detectors, various chemical and biological sensors, glucose sensors, pH sensors, ion sensors, etc.

Although not specifically shown, a smart tag in some embodiments may include internal and/or external power sources as shown in FIG. 2 as well as internal and/or external sensors as shown in FIG. 3.

In some embodiments, very small size smart tags may be manufactured by integrating various portions of a smart tag at a system level using integrated circuit chips, wafer level integration of system components, heterogeneous system component integration utilizing wafer level integration, panel level integration, roll to roll integration, component level integration or combinations of these and other techniques. For example, the processor, memory, internal power source and transceiver of a smart tag may be formed as an integrated circuit chip less than 10 millimeters (mm)$^3$ in size. In other embodiments the smart tag may be formed as an integrated circuit chip less than 1 mm$^3$ in size or less than 0.000125 mm$^3$ in size. Such low sizes are achieved using techniques described below, allowing for low cost and low power smart tags that may be utilized for various applications.

Integrated circuit chips or systems in some embodiments, even at the above-described small sizes, may be self-contained with components such as a microprocessor, non-volatile memory, and integrated energy scavenging devices and/or the ability to receive power from an external source. Integrated circuit chips or systems at such small sizes further provide for communication to and from the smart tag, using by way of example light for power and communication. The self-contained integrated circuit chip or system may further include integrated sensors.

In other embodiments, an integrated circuit chip or system may comprise a microcontroller or microprocessor, non-volatile memory, one or more sensors and/or other miniaturized functions for a smart tag while also utilizing one or more other components of a larger size to enable desired RF or NFC communication, energy sources or storage, sensors, etc. In such embodiments, miniaturization of at least a portion of the components forming the smart tag provides a means to reduce cost by fabricating more miniaturized smart tags or smart tag subsystems at a much lower cost and requiring much lower power consumption relative to other conventional techniques. Such costs and power savings in some embodiments are due at least in part to the close proximity of the smart tag electronic and/or optical functions.

Various embodiments are described below in the context of a smart tag referred to herein as "Bitsy" which is small enough to fit inside a cube with a length, width and height less than 50 micrometers ($\mu$m). It is important to note, however, that embodiments are not limited solely to smart tags that fit in a 50×50×50 $\mu$m cube. Instead, smart tags in some embodiments may have lengths, widths and heights of 0.5 mm or less or 0.05 mm or less. In addition, embodiments are not limited to smart tags that are perfect cubes. For example, the length, width and height of a smart tag may be different from one another in some embodiments. More generally, smart tags in some embodiments are less than 10 mm$^3$ in size. For applications in which even lower cost or low power are desired, smart tags may be less than 1 mm$^3$ in size down to less than 0.000125 mm$^3$ in size.

A Bitsy smart tag is powered using light. Data may be sent to a Bitsy smart tag by modulating the intensity of a light beam, and data may be received from a Bitsy smart tag by selectively reflecting an incident light beam. The use of light to power a Bitsy smart tag is one of the factors that allows the Bitsy smart tag to have such a small size. Light-based communication and power means, for example, allow for a significantly smaller footprint relative to other communication and power means such as RF antennas.

Embodiments, however, are not limited solely to use with smart tags that use light for power and/or communication. Instead, as discussed above various other power and communications means may be used. In addition, a smart tag may be formed as a very small (e.g., less than 10 or less than 1 mm$^3$ in size) integrated circuit chip so as to reduce the cost of producing a smart tag including the integrated circuit chip. The integrated circuit chip, however, may include contacts so that after fabrication, a larger antenna such as an RF antenna may be connected to the integrated circuit chip. Although the resulting structure of the smart tag apparatus would then be larger, the integrated circuit chip of the smart tag would still achieve low power and/or low cost advantages associated with the above-described small size.

A Bitsy smart tag has the following power requirements. The power source for Bitsy is solar radiation. The size of a Bitsy smart tag, as mentioned above, is a >50×>50×>50 $\mu$m cube. In one example, the die area of the Bitsy smart tag is 2.209×10$^{-9}$ meters (m)$^2$. Its energy per m$^2$ is 1000 Watts/m$^2$, with an energy conversion efficiency of 0.05$\eta$, resulting in energy of 1.1045×10$^{-7}$ W (0.11045 $\mu$W).

With the above power requirements, Bitsy smart tags formed using a 32 nm CMOS process with a die size of 0.002 mm$^2$ operate at 300 nW/megahertz (MHz). Thus, at 100 nW Bitsy smart tags can run at 0.3 MHz. In comparison, the Intel® Sandy Bridge microarchitecture is a 32 nm process with a die size of approximately 216 mm$^2$ operating at 170 $\mu$W/MHz, or 55 W at 1.5 Gigahertz (GHz). The Intel® Ivy Bridge microarchitecture is a 22 nm process with a die size of approximately 160 mm$^2$ operating at 166 $\mu$W/MHz, or 40 W at 1.5 GHz.

Bitsy smart tags utilize capacitors as an internal power source. Approximately half of the die area in a Bitsy smart tag may be a capacitor utilized for charge storage. With the die area of 2209 $\mu$m$^2$, utilizing half the die area provides for 424,000 femtoFarads (fF), or approximately 0.4 nanoFarads (nF) of capacitance. The stored charge is given by Q=CV, or 0.4 nanoCoulombs (nC) of electric charge for 0.4 nF of capacitance. The energy in the charged capacitor is given by E=½ CV$^2$, resulting in 0.2 nanojoules (nJ).

In some embodiments, a Bitsy smart tag may use deep trench capacitors for charge storage. In a 45 nm process, there are 264 fF/$\mu$m$^2$ at 18 fF per trench. In a 32 nm process, there are 384 fF/$\mu$m$^2$ at 15 fF per trench. In a 22 nm process, there are 461 fF/$\mu$m$^2$ at 12 fF per trench. In other embodiments other processes and types of capacitors may be used, including but not limited to parallel plate capacitors, metal-insulator-metal capacitors (MIMcaps) and other electronic capacitors.

Figure 4:
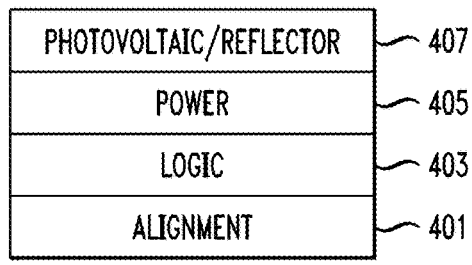
FIG. 4 depicts a layer structure of a smart tag, according to an embodiment of the invention.

FIG. 4 shows a layer structure of smart tag 104. The layer structure shown in FIG. 4 may be utilized for forming the above-described Bitsy smart tag. It is to be appreciated, however, that the layer structure in FIG. 4 may be used for forming smart tags having sizes and power requirements different than those described above with respect Bitsy smart tags.

As shown in FIG. 4, an alignment layer 401 is used to orient die during placement of additional layers an integrated circuit chip forming smart tag 104. The alignment layer 401 may be a ferromagnetic layer. The use of a ferromagnetic alignment layer allows for precision for very small devices. For example, a 300 mm wafer may be used to form more than 1 million smart tags or smart microsystems in some embodiments. Ferromagnetic alignment allows for precision alignment and may be used in combination with other techniques such as the use of precision tooling or other marking to achieve high heterogeneous integration yield.

The alignment layer 401 may be used for aligning the logic layer 403, power layer 405 and photovoltaic/reflector layer 407. Logic layer 403 may provide for the processor, memory and internal sensors of the smart tag 104. The power layer 405 provides for integrated charge storage in the integrated circuit chip. The photovoltaic/reflector layer 407 provides an internal power source, as well as means for communication. Collectively, the power layer 405 and photovoltaic/reflector layer 407 may be considered as providing an internal power source. The photovoltaic/reflector layer 407 further acts as a transceiver. The photovoltaic/reflector layer 407 can receive data at the integrated circuit chip via light beams, and send data out by reflecting or not reflecting incident light beams.

Although FIG. 4 illustrates an embodiment wherein the smart tag 104 includes photovoltaic/reflector layer 407, other types of transceivers and power sources may be used in other embodiments in addition to or in place of the photovoltaic/reflector layer 407. For example, communication with the smart tag may be by way of ultrasound vibration. In such cases, the photovoltaic/reflector layer 407 may be replaced with a piezoelectric layer. Other types of communications means or transceivers include the use of an antenna, which may be optimize for a desired frequency or communication/power transfer distance. In some instances, an antenna or antennas may be substantially larger than the above-described Bitsy smart tags when using RF or NFC communication. As described herein, however, even in such embodiments smart tags can offer significant cost and/or power savings.

It is to be appreciated that embodiments are not limited solely to the layer structure shown in FIG. 4. For example, in some embodiments two or more the layers shown in FIG. 4 may be formed as a single layer, or a single one of the layers may be separated into two or more additional layers. For example, the logic layer 403 may include a first layer providing a microprocessor or microcontroller, as well as one or more layers providing a non-volatile memory. As another example, the logic layer 403 and power layer 405 may in some embodiments be combined or arranged side by side rather than one on top of the other as shown in FIG. 4. Any number of arrangements may be used for the sub-functions or components of the smart tag or smart microsystem, with components and sub-functions selected to achieve ease of fabrication, low cost, or application specific specifications that benefit from a particular arrangement.

As an example of a low cost smart tag, consider a 32 nm CMOS process, which permits the construction of processors that occupy approximately 0.1 mm$^2$ die area. A 300 mm wafer may cost, for example, $5000, and provide 70,685 mm$^2$ in die area. Assuming a smart tag die size of 0.2 mm×0.2 mm, or 0.04 mm$^2$, 1,767,144 die may be formed per wafer. Thus, the materials cost of the smart tag is less than a penny, $0.0028 ($5000/1,767,144). While there may be some area loss due to singulation, the use of techniques such as deep reactive-ion etching (DRIE) can limit such losses to less than 2 µm wide between die. For a 50 µm×50 µm smart tag die size, the area loss would be approximately 16%. For a 100 µm×100 µm smart tag die size, the area loss would be approximately 4%.

Singulation and personalization of the die, however, become a bottleneck to extremely low cost electronics. Various processes used for 3D integration may be applied to overcome such bottlenecks. Saw dicing and laser dicing may be used to singulate die from a wafer. These techniques, however, can have a kerf width of approximately 40 to 200 µm. Note that the Bitsy smart tag described above is less than 50 µm on a side. As such, saw dicing and laser dicing can lead to inefficiencies for low cost smart tags. In some embodiments, saw dicing or laser dicing techniques are replaced with DRIE techniques, having a kerf width of less than 2 to 10 µm allowing for higher yield and thus lower costs relative to saw dicing or laser dicing.

Figure 5:
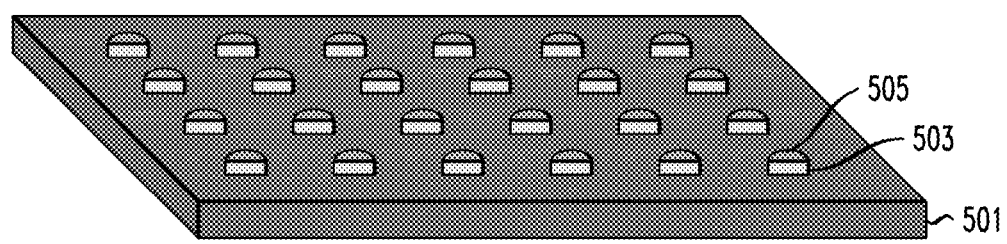
FIG. 5 depicts a wafer, according to an embodiment of the invention.

FIG. 5 shows a wafer 500, which may form multiple integrated circuit chips for a plurality of smart tags. The wafer 500 includes a silicon die 501, a plurality of dielets 503 formed on the silicon die 501, and photovoltaic reflector layers 505 formed over the dielets 503. The small dielets can be used to form smart tags, such as smart tag 104. Each dielet can form a small authentication device capable of secure authentication and attesting to firmware and software state. Physical tamper detection and response may also be provided using various sensors as discussed above. The dielet-based authentication devices, which are examples of smart tags, can be produced economically using various techniques described above.

Figure 6:
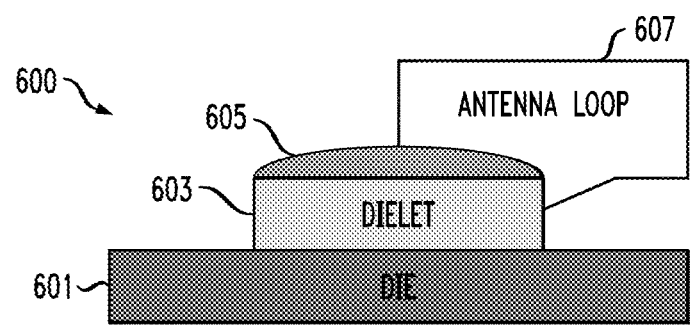
FIG. 6 depicts a side view of an integrated circuit chip formed from the wafer of FIG. 5, according to an embodiment of the invention.

FIG. 6 shows a side view of an integrated circuit chip 600 formed from the wafer 500 of FIG. 5. The integrated circuit chip 600 may form at least a portion of smart tag 104. The integrated circuit chip 600 in this embodiment includes die 601, dielet 603 formed over at least a portion of the die 601, and a photovoltaic reflector layer 605 formed over at least a portion of the dielet 603. The die 601 may provide for logic such as a microprocessor or microcontroller, while the dielet 603 may provide for power such as integrated charge storage. The photovoltaic reflector layer 605 may be used for communications and/or as an internal power source for the integrated circuit chip 600.

It is to be appreciated, however, that embodiments are not limited to the specific integrated circuit chip 600 shown in FIG. 6. In some embodiments, an integrated circuit chip may include more or fewer different heterogeneous layers or other structures. In some embodiments, non-volatile memory is provide by the die 601 and/or dielet 603. In other embodiments, an additional layer or layers may be used to provide non-volatile memory for an integrated circuit chip.

The die 601, dielet 603 and photovoltaic reflector layer 605 are heterogeneous structures. Integrating such heterogeneous structures requires building interconnects between the die 601, dielet 603 and photovoltaic/reflector layer 605. Vertical alignment of the die 601, dielet 603 and photovoltaic reflector layer 605 is a challenging task at small scales such as the sizes of the above-described Bitsy smart tag. In order to economically produce very small smart tags, such as Bitsy smart tags, the pitch between the die 601, dielet 603 and photovoltaic reflector layer 605 should be reduced using techniques including but not limited to post wafer bonding techniques such as through polymer or through oxide etch and metallization techniques used in via-last through-silicon vias (TSVs), wafer to wafer integration or by means of small micro pillar interconnections or other integration techniques.

Various methods may be used to form interconnects between the die 601, dielet 603 and photovoltaic reflector layer 605. As one example, micro controlled-collapse chip-connection (C4) interconnects may be used. Micro C4 interconnects may be formed on the die 601, dielet 603 and/or photovoltaic reflector layer 605 prior to bonding the die 601, dielet 603 and photovoltaic reflector layer 605 together. In this case, micro C4 or micro-pillar interconnections may be achieved by wafer to wafer alignment and bonding using precision placement and solder reflow of solder bumps or pillars to adjacent pads, bumps and/or pillars at a pitch of, by way of example but not limited to, less the 5 to 25 µm. Similarly, multiple groups of sub-components integration may be achieved with quarter wafer alignment and bonding. Alignment may be achieved using a minimum of two alignment marks per wafer using split optics, infrared (IR) camera imaging to look through the wafers to be joined, or precision placement and solder surface tension structures that pull wafer components into alignment at a wafer or component level.

As an alternative, interconnects between the die 601, dielet 603 and photovoltaic reflector layer 605 may be formed by bonding the die 601, dielet 603 and photovoltaic reflector layer 605 together, followed by drilling down between the layers to form interconnects, achieving approximately 2-5 µm pitch. Examples of post-wafer bonding interconnections include the use of oxide to oxide bonding, post bonding through dielectric (polymer or oxide) vias (TDV) using methods such as but not limited to etching, metallization followed by chemical-mechanical polishing, etc.

As shown in FIG. 6, the smart tag 104 also includes an antenna loop 607. The antenna loop 607 may be used to facilitate communication with the smart tag 104 and/or to provide power to the smart tag 104. Thus, the antenna loop 607 may be used in addition to, or in some embodiments in place of, the photovoltaic reflector layer 605 for supporting two-way communication with the smart tag 104. The antenna loop 607 may be used to support various types of wireless communications, such as near field communication (NFC) or other RF communications. The antenna loop 607 may be connected to the integrated circuit chip 600 via micro C4 connections in some embodiments.

In some embodiments, the antenna loop 607 may be larger than the integrated circuit chip 600 itself. The integrated circuit chip 600 may be formed to conform to the Bitsy requirements in some embodiments, therefore providing a low cost and low power smart tag even though the later bonding or other connection of the antenna loop 607 to the integrated circuit chip 600 may cause the resulting structure to exceed Bitsy requirements. Nevertheless, the resulting structure will still have significant cost advantages and many aspects of the low power advantages and functions of the integrated electronics described herein.

While the antenna 607 is shown in FIG. 6 and described above as a loop antenna, embodiments are not limited solely to use with loop antennas. Instead, various other types of antennas may be used, including but not limited to antenna arrays and aperture antennas. In some embodiments, a smart tag may have one or more antennas to support the optimization of power delivery and one or multiple different communications methods. For example, in some embodiments, a smart tag may be configured for multiple different communication protocols to interact with different types of devices, such as other smarts tags and sensors, readers, smartphones, clouds or servers, etc.

Integrated circuit chips, such as the integrated circuit chip 600, can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method comprising:
forming a structure, the structure comprising at least one of a wafer, a panel and a roll to roll structure;
forming a plurality of integrated circuit chips from the structure;
wherein at least a given one of the plurality of integrated circuit chips or a heterogeneous integrated sub-component thereof forms a smart tag comprising a processor, a non-volatile memory, an internal power source and a transceiver configured for two-way communication with a reader external to the smart tag;
wherein the given integrated circuit chip is less than 10 cubic millimeters in size;
wherein the given integrated circuit chip comprises:
a first silicon die portion comprising at least the processor;
a first dielet formed over the first silicon die portion and comprising at least a portion of the internal power source via one or more capacitors formed therein; and
a first photovoltaic reflector formed over the first dielet, the first photovoltaic reflector comprising a photovoltaic layer comprising at least a portion of the internal power source and a reflector providing at least a portion of the transceiver; and
wherein the first silicon die portion, the first dielet and the first photovoltaic reflector are interconnected via at least one micro controlled-collapse chip-connection interconnect.

2. The method of claim 1, wherein the structure comprises:
an alignment layer;
a logic layer over the alignment layer, the logic layer providing at least a portion of the processor;
a power layer over the logic layer, the power layer providing at least a portion of the internal power source.

3. The method of claim 2, wherein the alignment layer comprises a ferromagnetic alignment layer.

4. The method of claim 1, wherein forming the plurality of integrated circuit chips from the structure comprises singulating the plurality of integrated circuit chips from the structure utilizing deep silicon etching having a kerf width less than 10 micrometers.

5. The method of claim 1, wherein the structure comprises:
a silicon die comprising the first silicon die portion;
a plurality of dielets including the first dielet formed over the silicon die; and
photovoltaic reflectors including the first photovoltaic reflector formed over the plurality of dielets;
wherein the plurality of integrated circuit chips are formed from the wafer by separating portions of the silicon die, where each portion of the silicon die has at least one of the plurality of dielets formed thereon.

6. The method of claim 5, wherein the structure comprises a plurality of interconnects formed between the silicon die and the dielets using at least one of micro controlled-collapse chip-connection (C4) interconnects, micro-pillars and one or more other interconnections between layers or within one of the heterogeneous integrated subcomponents of the structure.

7. The method of claim 1, wherein the given integrated circuit chip is less than 1 cubic millimeter in size.

8. The method of claim 1, wherein the given integrated circuit chip has a length less than 0.5 millimeters, a width less than 0.5 millimeters and a height less than 0.5 millimeters.

9. The method of claim 1, wherein the given integrated circuit chip has a length less than 0.05 millimeters, a width less than 0.05 millimeters and a height less than 0.05 millimeters.

10. The method of claim 1, further comprising connecting an antenna to the smart tag.

11. The method of claim 10, wherein the antenna is configured to provide two-way communications between the transceiver of the smart tag and a reader.

12. The method of claim 10, wherein the antenna is configured to provide power to the integrated circuit chip.

13. The method of claim 10, wherein the antenna is larger than the integrated circuit chip.

14. A method of forming a smart tag comprising:
    forming a silicon die comprising at least a processor;
    forming a dielet over the silicon die, the dielet comprising at least a portion of an internal power source for the smart tag;
    forming a photovoltaic reflector over the dielet, the photovoltaic reflector comprising a photovoltaic layer and a reflector, the photovoltaic layer comprising at least a portion of the internal power source and the reflector comprising at least a portion of a transceiver of the smart tag configured for two-way communication with a reader external to the smart tag; and
    forming at least one micro controlled-collapse chip-connection interconnect between the silicon die, the dielet and the photovoltaic reflector.

15. The method of claim 14, wherein the smart tag comprises an integrated circuit chip less than 10 cubic millimeters in size.

16. The method of claim 14, wherein the smart tag comprises an integrated circuit chip less than 1 cubic millimeter in size.

17. The method of claim 14, wherein the smart tag comprises an integrated circuit chip having a length less than 0.5 millimeters, a width less than 0.5 millimeters and a height less than 0.5 millimeters.

18. The method of claim 14, wherein the smart tag comprises an integrated circuit chip having a length less than 0.05 millimeters, a width less than 0.05 millimeters and a height less than 0.05 millimeters.

19. The method of claim 14, further comprising forming one or more capacitors in the dielet.

20. The method of claim 19, wherein one or more of the capacitors comprise deep trench capacitors.

* * * * *